United States Patent
Busletta et al.

(10) Patent No.: US 7,852,635 B1
(45) Date of Patent: Dec. 14, 2010

(54) MULTI-CONNECTION VIA

(75) Inventors: Galliano R. Busletta, Mesquite, TX (US); Robert J. Roessler, Rockwall, TX (US)

(73) Assignee: Lineage Power Corporation, Plano, TX (US)

( * ) Notice: Subject to any disclaimer, the term of this patent is extended or adjusted under 35 U.S.C. 154(b) by 1547 days.

(21) Appl. No.: 10/853,456

(22) Filed: May 25, 2004

(51) Int. Cl.
*H05K 1/11* (2006.01)
*H05K 1/14* (2006.01)

(52) U.S. Cl. .................. 361/784; 361/794; 361/795; 174/262; 174/265

(58) Field of Classification Search .......... 174/260–266
See application file for complete search history.

(56) References Cited

U.S. PATENT DOCUMENTS

| | | | |
|---|---|---|---|
| 4,801,489 A * | 1/1989 | Nakagawa et al. | 428/209 |
| 4,830,704 A * | 5/1989 | Voss et al. | 216/18 |
| 4,906,198 A * | 3/1990 | Cosimano et al. | 439/82 |
| 5,027,191 A * | 6/1991 | Bourdelaise et al. | 257/735 |
| 5,293,069 A * | 3/1994 | Kato et al. | 257/698 |
| 5,404,044 A * | 4/1995 | Booth et al. | 257/698 |
| 5,406,034 A * | 4/1995 | Frei et al. | 174/266 |
| 5,418,689 A * | 5/1995 | Alpaugh et al. | 361/792 |
| 5,487,218 A * | 1/1996 | Bhatt et al. | 29/852 |
| 5,562,971 A * | 10/1996 | Tsuru et al. | 428/209 |
| 5,835,254 A * | 11/1998 | Bacon | 359/254 |
| 6,181,219 B1 * | 1/2001 | Gailus et al. | 333/33 |
| 6,486,408 B1 * | 11/2002 | Morris | 174/254 |
| 6,590,165 B1 * | 7/2003 | Takada et al. | 174/266 |

* cited by examiner

*Primary Examiner*—Tuan T Dinh

(57) ABSTRACT

The present invention provides a PWB for attaching electrical components thereto. One aspect of the PWB includes multiple PWB insulating layers having conductive traces therebetween. The PWB has an interconnect opening located in the multiple PWB insulating layers that intersect at least a portion of the conductive traces. The interconnect opening has ledges therein, wherein each of the ledges separates a first group of the conductive traces from a second group of the conductive traces. The present invention also provides a method of making the PWB and also provides a power converter implementing the edge plate interconnects.

14 Claims, 11 Drawing Sheets

MULTI-CONNECTION VIA

TECHNICAL FIELD OF THE INVENTION

The present invention is directed, in general, to printed wiring boards (PWB) and, more specifically, to a PWB having a multi-connection via therein.

BACKGROUND OF THE INVENTION

In general, the demand for smaller, yet more powerful, electronic circuit modules, which have more features or capabilities and greater component density than their predecessors, has been increasing. This is especially true in the case of PWBs configured as power converters that are often employed in power supplies. A power converter is a power processing circuit that converts an input voltage waveform into a specified output voltage waveform. In many applications requiring a DC output, switched-mode DC/DC power converters are frequently employed to an advantage wherein both high conversion density and converter efficiency are key design requirements.

In these devices, and PWBs in general, electrical connections between the various layers and components are typically accomplished with the use of vias, which, as is well known, are openings or holes that extend through the board and that typically have a conductive material, such as solder, therein. In conventional vias, the conductive material covers the entire interior wall of the via. In such structures, any conductive trace that the via intersects is electrically connected to every other conductive trace that also intersects that same via. Thus, only one electrical connection can be made for each via, which requires multiple vias to make the multiple connections for PWB's having a high component density. For example, in technologies that implement core-on-board transformer technologies, many vias are required to make the necessary connections to various field effect transistors (FETs), transformers and inductors.

As such, these vias consume valuable board space. When the board layout is complex and includes many electrical components, the number of vias (and the concomitant amount of board space consumed by them) increase dramatically. When a larger number of vias are required for the board layout, it becomes very difficult for manufacturers to keep the board dimensions and layout within specified design requirements and yet still make the number of electrical connections that are required for the desired operation of the device. In addition, the typical via is a through-hole via, and since it goes through all layers, routing of conductive traces on internal layers becomes an issue. Moreover, the electronics industry is quickly moving to on-board technology where more, if not all, of the components are formed directly on or within the board itself. This advancement in technology reduces the number of separate components that are soldered directly to the board. Thus, it is becoming ever more imperative that all space of the board is efficiently utilized.

In an attempt to increase the amount of space on the PWBs, manufacturers have turned to a couple of processes. One such process is a controlled depth via. In this process, a hole is drilled to a certain depth sufficient to connect a given number of conductive metal layers together. The board can then be drilled in a similar fashion on the reverse side. While this controlled depth technique allows for a couple of separate interconnections, it is time consuming, not reliable, produces poor manufacturing yields, and thus, is costly to achieve. Additionally, it does not provide an adequate decrease in overall number of vias that must be drilled in the PWB.

Another process employed by the industry is the buried via technique where a partial via is made in two or more PWB conductive layers of the board. The layers are electrically connected together, and then they are covered by subsequent PWB layers. Internal layers are drilled and plated for a buried via or laminated, drilled, and plated for a buried or through hole via connecting more than two conductive layers. This has basically the same effect as the controlled depth technique as above, but unfortunately suffers greater disadvantages in that this process is even more time consuming and more costly than the controlled depth technique.

Accordingly, what is needed is PWB with an interconnect system that over comes the disadvantages associated with via of the prior art PWBs.

SUMMARY OF THE INVENTION

To address the above-discussed deficiencies of the prior art, the present invention provides a PWB for attaching electrical components thereto. In one embodiment, the PWB includes multiple insulating layers having conductive traces therebetween. The PWB has an interconnect opening located in the insulating layers that intersects at least a portion of the conductive traces. The interconnect opening has ledges therein, wherein each of the ledges separates a first group of the conductive traces from a second group of the conductive traces.

In another embodiment, there is provided a method of manufacturing electrical interconnects for a PWB. In this embodiment, the method includes providing multiple insulating layers having conductive traces located therebetween, and forming an opening in the insulating layers and intersecting the conductive traces. The opening has ledges therein wherein each of the ledges separates a first group of the conductive traces from a second group of the conductive traces.

In another aspect, there is provided a power converter. In this embodiment, the power converter includes a PWB having multiple insulating layers having conductive traces therebetween. The PWB has an interconnect opening extending through the insulating layers that intersects the conductive traces. The interconnect opening has ledges therein, wherein each of the ledges separates a first group of the conductive traces from a second group of the conductive traces. The power converter further includes a first conductive layer that electrically connects the conductive traces in the first group with each other and a second conductive layer that electrically connects the conductive traces in the second group with each other. The first group and the second group are electrically isolated from each other. A transformer is also included, and it includes primary and second windings. The primary winding is coupled to a primary circuit by at least one via and the secondary winding is coupled to a secondary circuit by at least one of the conductive traces.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

The present invention provides an interconnect that allows multiple and separate connections to be made in a single opening in or through a PWB. This unique interconnect technology provides several advantages over the prior art in that it allows for more diverse electrical interconnections throughout the board, while providing additional space on the board. This additional space allows the manufacturer to achieve increased component densification. As discussed in more detail below, the interconnect may be used to make interconnections between conductive layers, such as windings of a transformer and its associated components by placing the connection within an a single interconnect opening or a core-on-board opening that is already required by the design or another cut-out that might exist or be purposefully made in the PWB for such an application. Additionally, the interconnect may be placed at an outer perimeter edge of the PWB to interconnect layers that sufficiently extend to the edge. All of these alternative locations afford a significant increase in the number of connections to various components that can be made without sacrificing space within interior portions of the PWB, thus meeting industry's strict size and component density requirements for on-board technologies.

Figure 1:
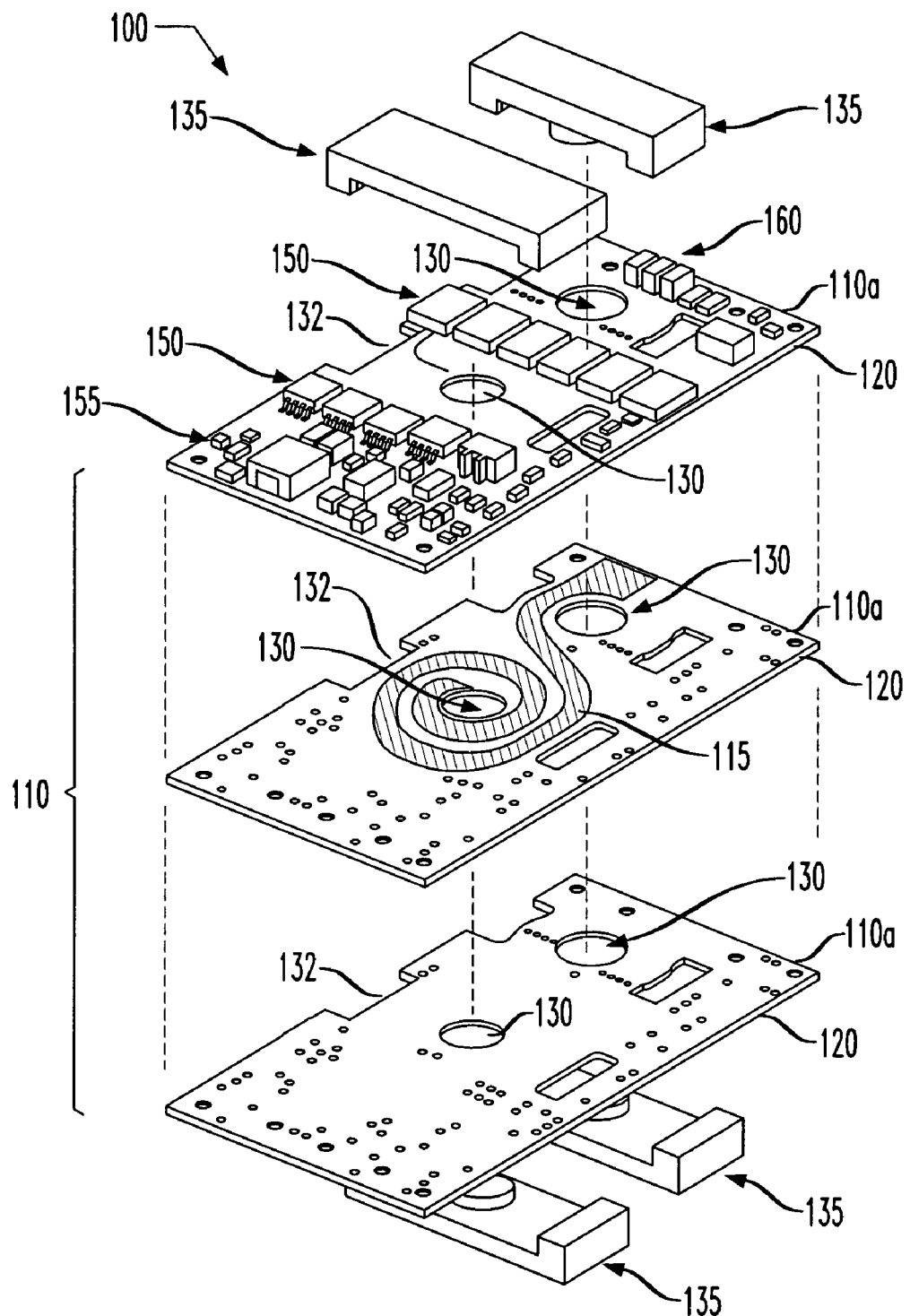
FIG. 1 illustrates a simplified, exploded view of an embodiment of a power converter formed on a PWB constructed according to the principles of the present invention.

Referring initially to FIG. 1, illustrated is a simplified, exploded view of an embodiment of a power converter 100 formed on a PWB 110, constructed according to the principles of the present invention. It should be noted at the outset that while detailed discussion is primarily directed to a power converter device, this is exemplary in nature only. Thus, the present invention is applicable in any PWB that can be used for any type of electrical application. In the exemplary embodiment shown in FIG. 1, the PWB 110 includes multiple insulating layers 110a and conductive layers, as individually described below. In an advantageous embodiment, these insulating layers 110a are constructed with conventional materials. The number and configuration of these layers in the PWB 110 depends on the design and overall requirements (e.g., power) of the device in which it is to be used. The PWB 110 also includes a conductive interconnect 115, such as a conventionally patterned copper layer trace, formed on one of the insulating layers 110a. Even though the present figure illustrates just one conductive layer 115, it should be understood that, typically, a conductive layer 115 will be located between each pair of insulating layers 110a, and each conductive layer 115 will be patterned to design specifications, and in some instances, will have different pathway and interconnect configurations. However, designs may vary, and a conductive layer may not necessarily be between every pair of insulating layers 110a or may even be a trace on top of the PWB itself.

The insulating layers 110a have an edge 120 at the exterior perimeter of the PWB 110 and openings 130 that are formed through the PWB 110. In one embodiment, the opening 130 may be an interconnect, such as a via. Alternatively, the opening 130 may serve as a pass through opening for a magnetic core element 135, such as the illustrated e-type magnetic core that can form a transformer or an inductor for the power converter 100. The transformer may include primary and second windings where the primary winding is coupled to a primary circuit by at least one via, and the secondary winding is coupled to a secondary circuit by at least one conductive interconnect or trace that intersects the opening 130. However, in other embodiments, the opening may simply be an intentional cut-out 132 for providing an edge plating surface, or it may be an opening formed for some other component that is intended to be attached to the PWB 110.

Further illustrated in this exploded view are other conventional electrical components, such as FETs 150, resistors 155, and capacitors 160, all of which may be employed in the power converter 100. With a general overview of the PWB 110 having been described, a more detailed discussion of the interconnect will now be discussed with respect to exemplary embodiments of the PWB 110.

It should be understood that the fabrication processes and materials used to make the PWB 110, as described herein, may be conventional, and the processes and materials used to plate conductive metal onto the interior wall of the interconnect may also be conventional. Those skilled in the art, when made aware of the present invention, will be able to construct the PWB 110 and power converter 100 using conventional fabrication and plating techniques.

Figure 2:
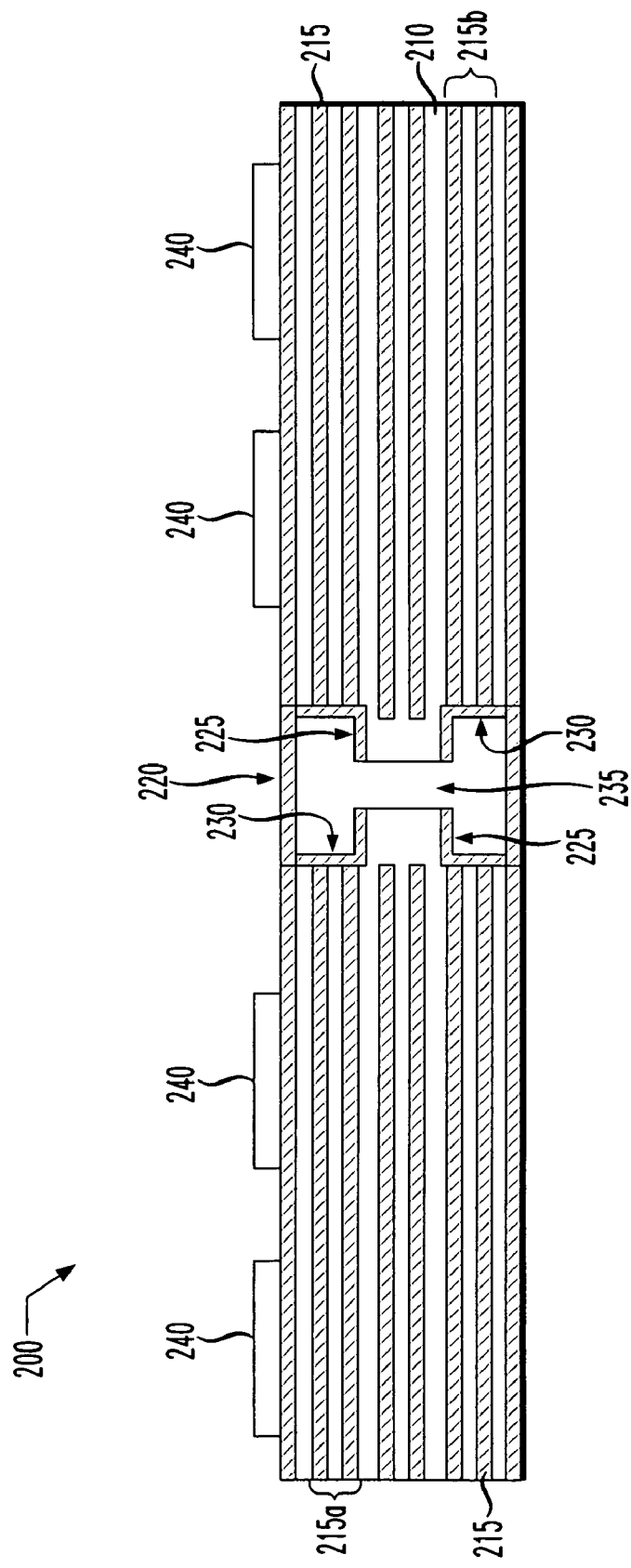
FIG. 2 illustrates an enlarged, partial sectional view of a PWB having an interconnect as provided by one embodiment of the present invention.

Turning now to FIG. 2, there is illustrated an enlarged, partial sectional view of a PWB 200 as covered by one embodiment of the present invention. The PWB 200 includes multiple insulating layers 210 that are of conventional construction and design. Conductive interconnects, such as conductive traces 215, only two of which are designated for simplicity, are located between the insulating layers 210. These conductive traces 215 are also of conventional construction and design. The conductive traces 215 may be of any configuration or design as required by the application in which they are to be used. For example, the conductive traces 215 may be a trace pattern, as shown in FIG. 1 or may have some other design layout.

Also shown is an interconnect 220 formed in the PWB 200 that intersects at least a portion of the conductive traces 215. As shown in the illustrated embodiment, however, the interconnect 220 is an opening that extends through the entire thickness of the PWB 200. The opening may be located anywhere on the board and may be of any geometric design. For example, the opening may be a via interior to the perimeter of the PWB 200 or it may be a cut-out located at the outer perimeter of the PWB 200. The interconnect 200 has within its circumference ledges 225. As can be seen from FIG. 2, the ledges 225 separate a first group of conductive traces 215a from a second group of conductive traces 215b, only two of which are designated. A conventionally formed conductive layer 230 overlies an interior wall of the interconnect 220, and when the conductive layer 230 is separated by a common opening 235, as shown, the first group and second group 215a,215b of conductive traces are electrically isolated from each other. Also, it should be noted that the number of ledges formed within the circumference of the interconnect 220 may vary, as discussed below. Various electrical components 240, such as those mentioned above, are located on the PWB 200 and can be interconnected using the interconnect 220. With a description of the PWB 200 having now been generally discussed, a more detailed discussion of its fabrication will be described below.

Figure 3A:
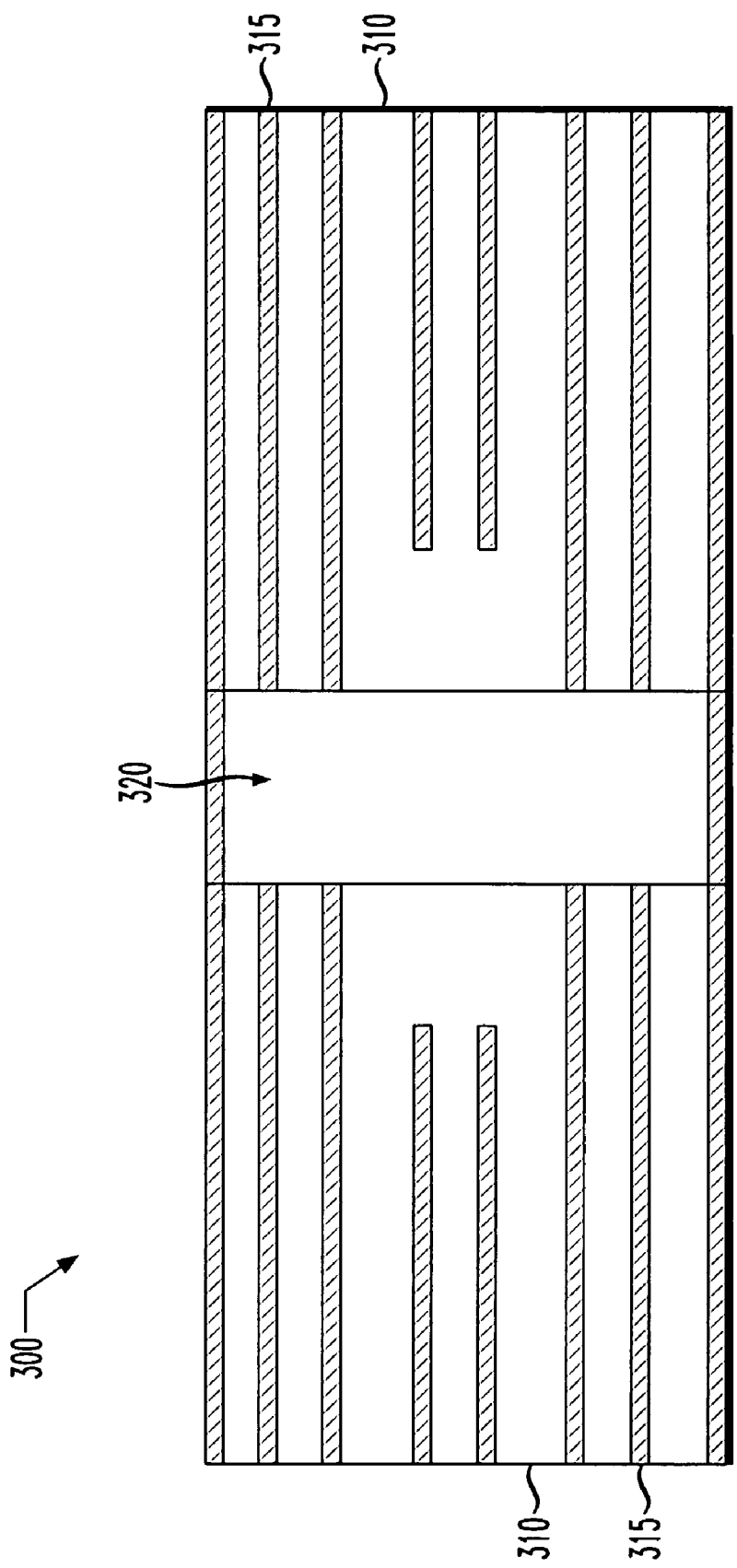
FIG. 3A illustrates an enlarged, partial sectional view of the PWB of FIG. 2 at an early stage of manufacture showing an opening made through the PWB.

Turning now initially to FIG. 3A, there is shown an enlarged, partial sectional view of a PWB 300 at an early stage of fabrication. Like the PWB 200 of FIG. 2, the PWB 300 includes multiple insulating layers 310 that have conductive traces 315 therebetween, again only a couple of which have been designated for simplicity. In this embodiment, there is shown an opening 320 formed through the PWB 300, which in this embodiment, is a pilot opening. The opening 320, in one embodiment, is formed by drilling a hole through the PWB 300, which can be accomplished with a conventional drill tool, laser, or other cutting mechanism capable of creating the opening 320, such as a router. The opening 320 is not limited to any one geometric shape. For example, the opening 320 may be circular, or it may have a rectangular shape. Further, as mentioned above, the location of the opening 320 on the PWB 300 may be any where there is need for an interconnect structure, including the edge of the PWB 300. In those embodiments that use a drill, the size of the drill will, of course, vary depending on the design and overall size of the completed interconnect structure.

Figure 3B:
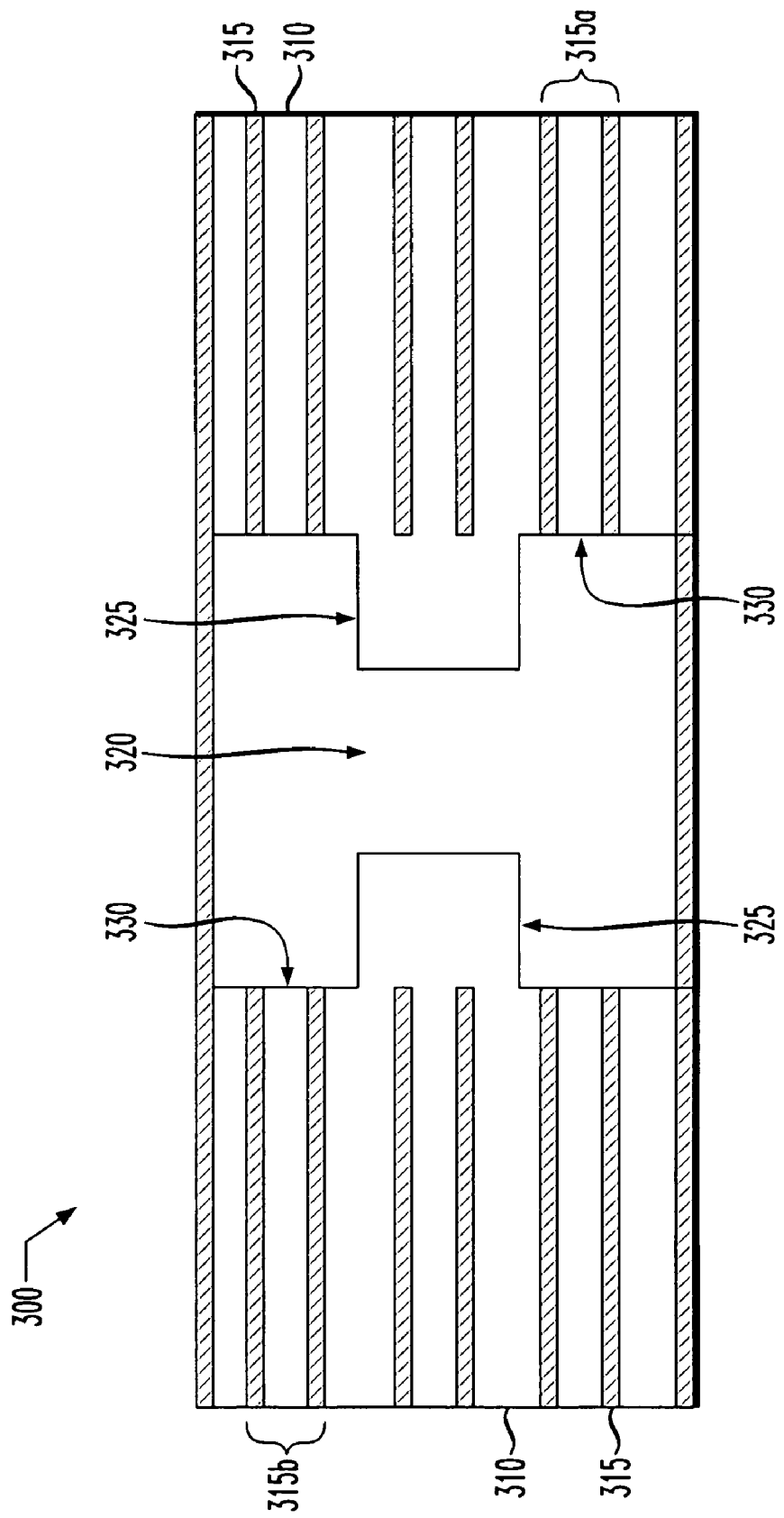
FIG. 3B illustrates an enlarged, partial sectional view of the PWB of FIG. 3A after formation of interconnect openings made in opposite sides of the PWB.

Turning now to FIG. 3B, there is shown an enlarged, partial sectional view of the PWB 300 of FIG. 3A subsequent to the formation of ledges 325. The ledges 325 may be formed in a number of ways. In one embodiment, the ledges 325 are formed using a drill bit that has a larger diameter than the drill bit used to form the opening 320. The drill bit is used to drill to a depth sufficient to intersect the desired number of conductive traces 315 and form interconnect openings 330. Those who are skilled in the art, given the teachings herein, would understand how to stagger the drill sizes to achieve the desired interconnect structure. For example, the drill bit sizes may range from about 0.022 inches to about 0.40 inches. As seen in FIG. 3B, the interconnect openings 330 have larger circumferences than the opening 320 and are formed in such a way to form openings that are substantially concentric with the opening 320. Also seen from FIG. 313 is the aspect that the interconnect openings 330 can be formed on opposite sides of the PWB 300. In such embodiments, the opening 320 is common to the opposing interconnect openings 330. Alternatively, one interconnect opening 330 may be formed in only one side of the PWB 300. As mentioned above, the ledges 325 of the interconnect opening 320, respectively, can be configured to separate a first group of conductive traces 315a from a second group of conductive traces 315b.

In one embodiment, the interconnect openings 330 may be formed using another cutting tool, such as a router, whose blade can be adjusted to different depths to form the ledges 325. In another aspect, the interconnect openings 330 may be formed first, after which, opening 320 may be formed using a drill or other cutting tool that will result in the opening 320 having a circumference that is smaller than the interconnect openings 330.

Figure 3C:
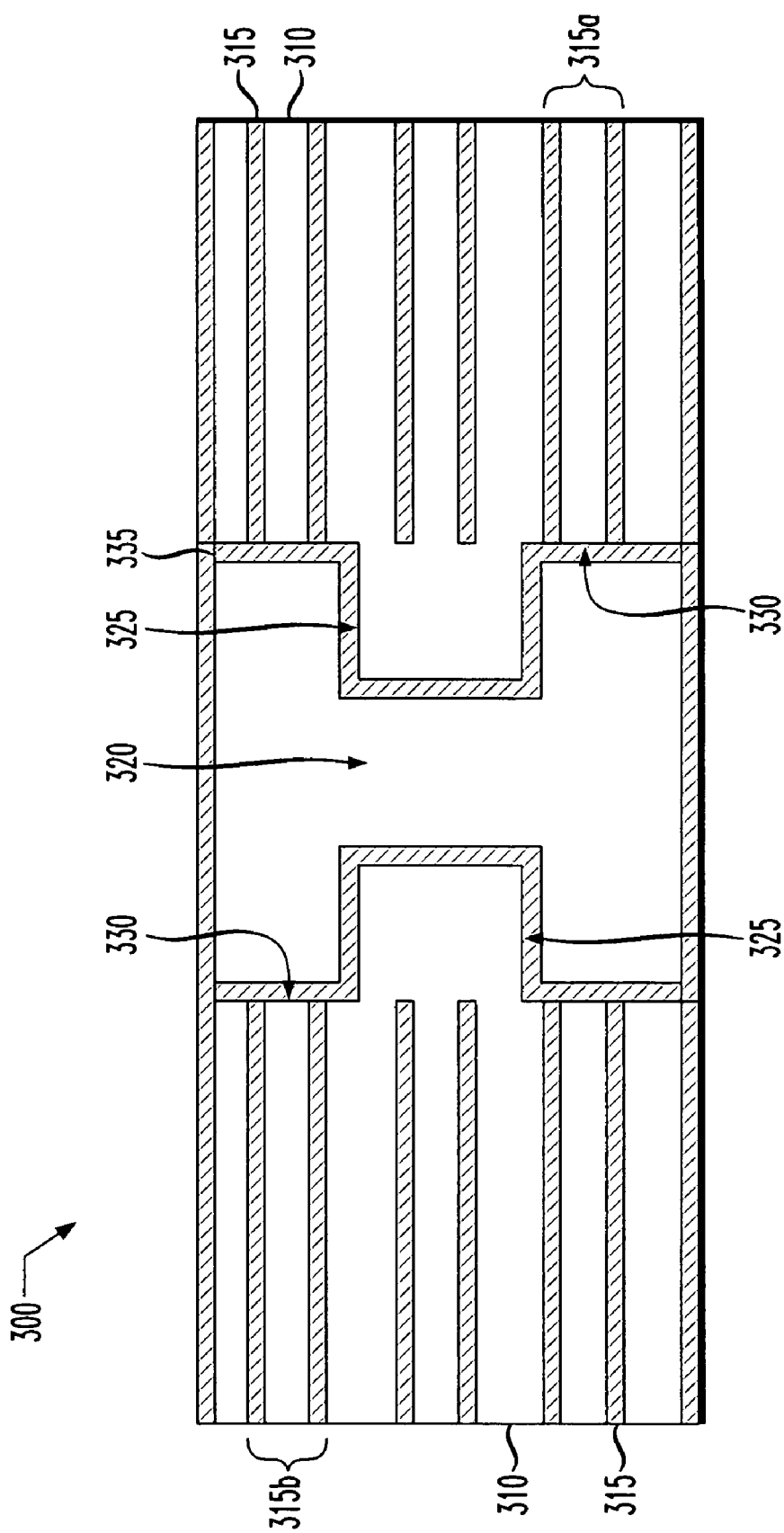
FIG. 3C illustrates an enlarged, partial sectional view of the PWB of FIG. 3B after formation of a conductive layer within the common opening and interconnect openings.

Turning now to FIG. 3C, there is illustrated a partial, sectional view of the PWB 300 of FIG. 3B after a conventional deposition of a conductive layer 335. The conductive layer 335 may be deposited using the same processes used to plate conventional vias in PWBs. Thus, one skilled in the art will understand how to achieve such a deposition. As seen at this point of the fabrication process, the conductive layer 335 contacts all of the conductive traces 315 that abuts openings 330, and it also covers the opening 320 that is common to and joins the interconnect openings 330. While in some embodiments, the conductive layer 335 may be left as shown, other embodiments provide for the partial removal of the conductive layer 335 within the portion of the opening 320 that is common to the interconnect openings 330.

Figure 3D:
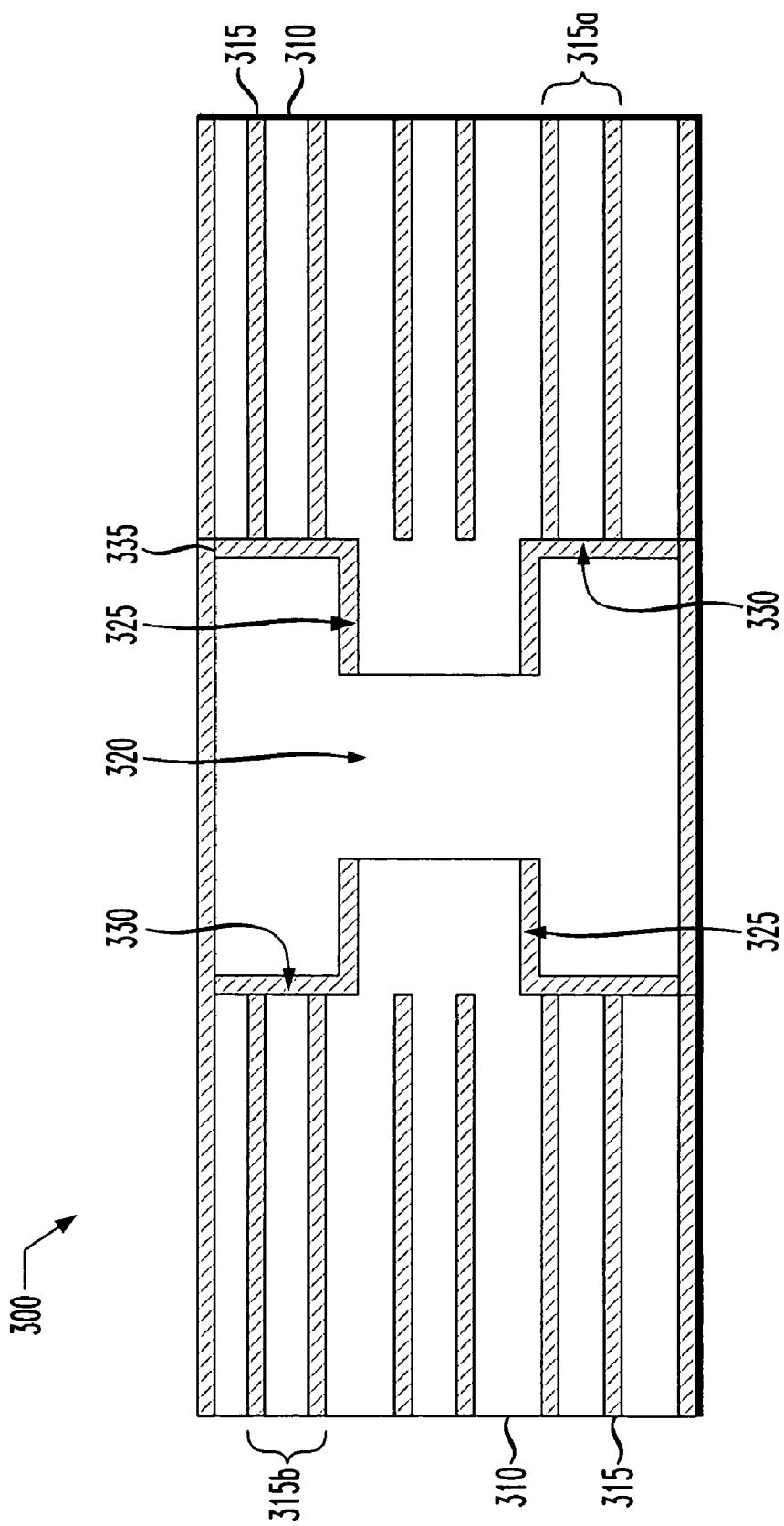
FIG. 3D illustrates an enlarged, partial sectional view of the PWB of FIG. 3C after removal of a portion of the conductive layer within the common opening.

FIG. 3D illustrates an enlarged, partial sectional view of the PWB 300 after the removal of the conductive layer 335 in opening 320. In an advantageous embodiment, the conductive layer 335 is removed from the interconnect opening 320 in the common region by drilling or cutting away that portion of the conductive layer 335 that resides in the common region of the opening 320. This removal leaves the ledges 325 and electrically separates the first group of conductive traces 315a from the second group of conductive traces 315b. The partial removal of the conductive layer 335, in essence, forms a first conductive layer that electrically connects the first group of conductive traces 315a with each other and forms a second conductive layer that electrically connects the second group of conductive traces 315b with each other.

Figure 4A:
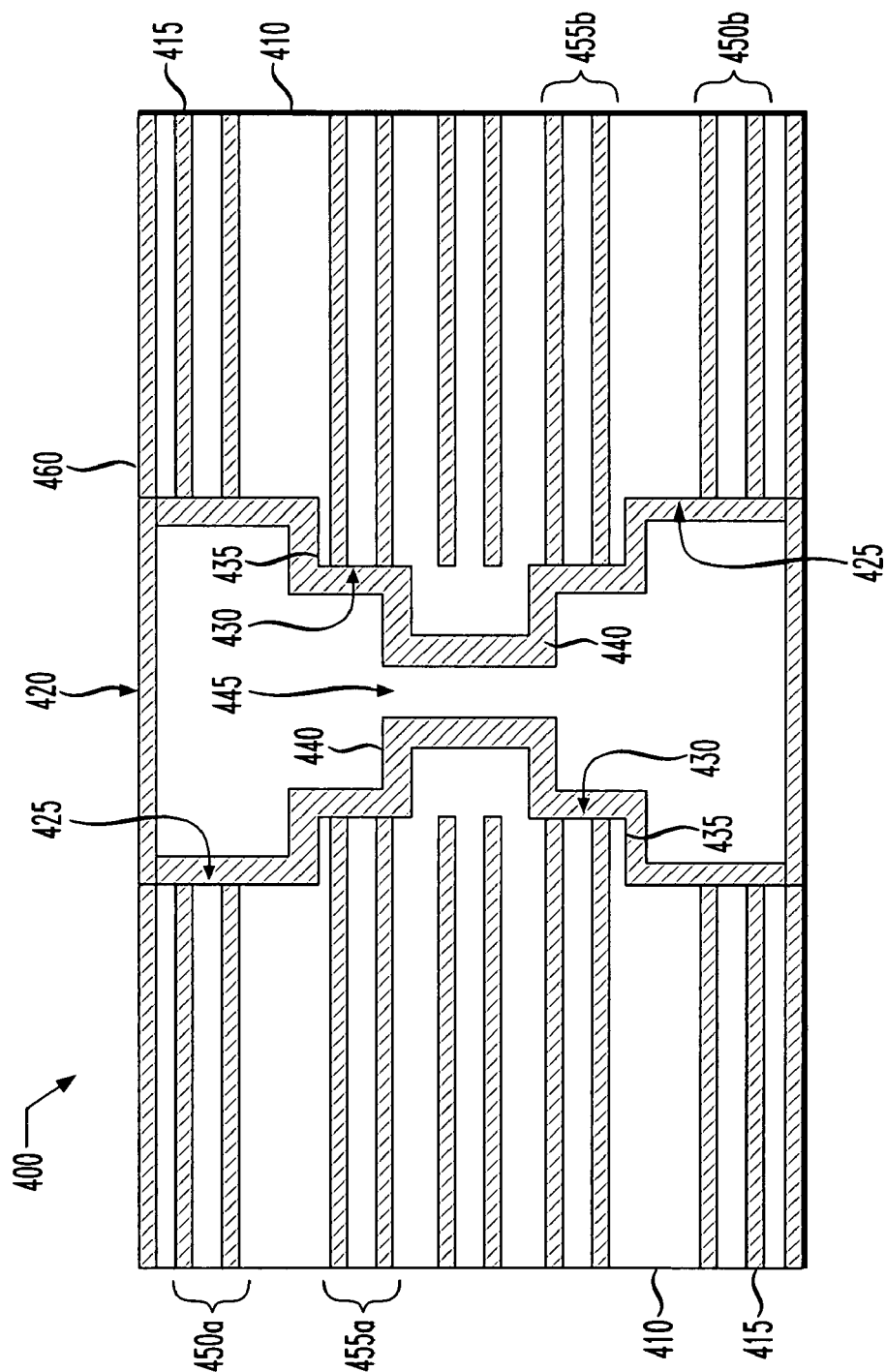
FIG. 4A illustrates an enlarged, partial sectional view of another embodiment of an interconnect having multiple interconnect openings formed in a single opening.

Turning now to FIG. 4A, there is illustrated an enlarged, partial sectional view of another embodiment of a PWB 400. The embodiment illustrated in FIG. 4A is an expansion of the embodiments described above. As in the other embodiments, the PWB 400 includes multiple insulating layers 410 that have conductive traces 415 located therebetween. Formed in the PWB 400 is an interconnect 420. In this embodiment, the interconnect 420 includes substantially concentric first interconnect openings 425 and second interconnect openings 430 formed in opposite sides of the PWB 400 and that are substantially co-aligned with each other. It should be understood that the openings as described therein do not necessarily have to be concentric, but in some embodiments, may be off-centered with respect to each other. As with previous embodiments, these interconnect openings 425,430 need not be formed in both sides, but may be formed in only one side. The first and second interconnect openings 425,430 have ledges 435,440, respectively associated therewith, that form a stair-stepped configuration. A common opening 445 joins the first and second interconnect openings 425,430.

The interconnect openings 425 intersect a first group of conductive traces 450a and 450b and the interconnect openings 430 intersect a second group of conductive traces 455a and 455*b*. A conventionally formed conductive layer 460 electrically connects the various conductive traces 415 together.

The first and second interconnect openings 425,430 may be formed in the same way as previously discussed above. However, in this embodiment, either sequential sized drill bits can be used to form the corresponding interconnect openings 425,430 where the openings are made by drilling, or sequential sized patterns can be used to form the corresponding interconnect openings 425,430 where the openings are formed by other cutting processes, such as those employing a laser or router.

Figure 4B:
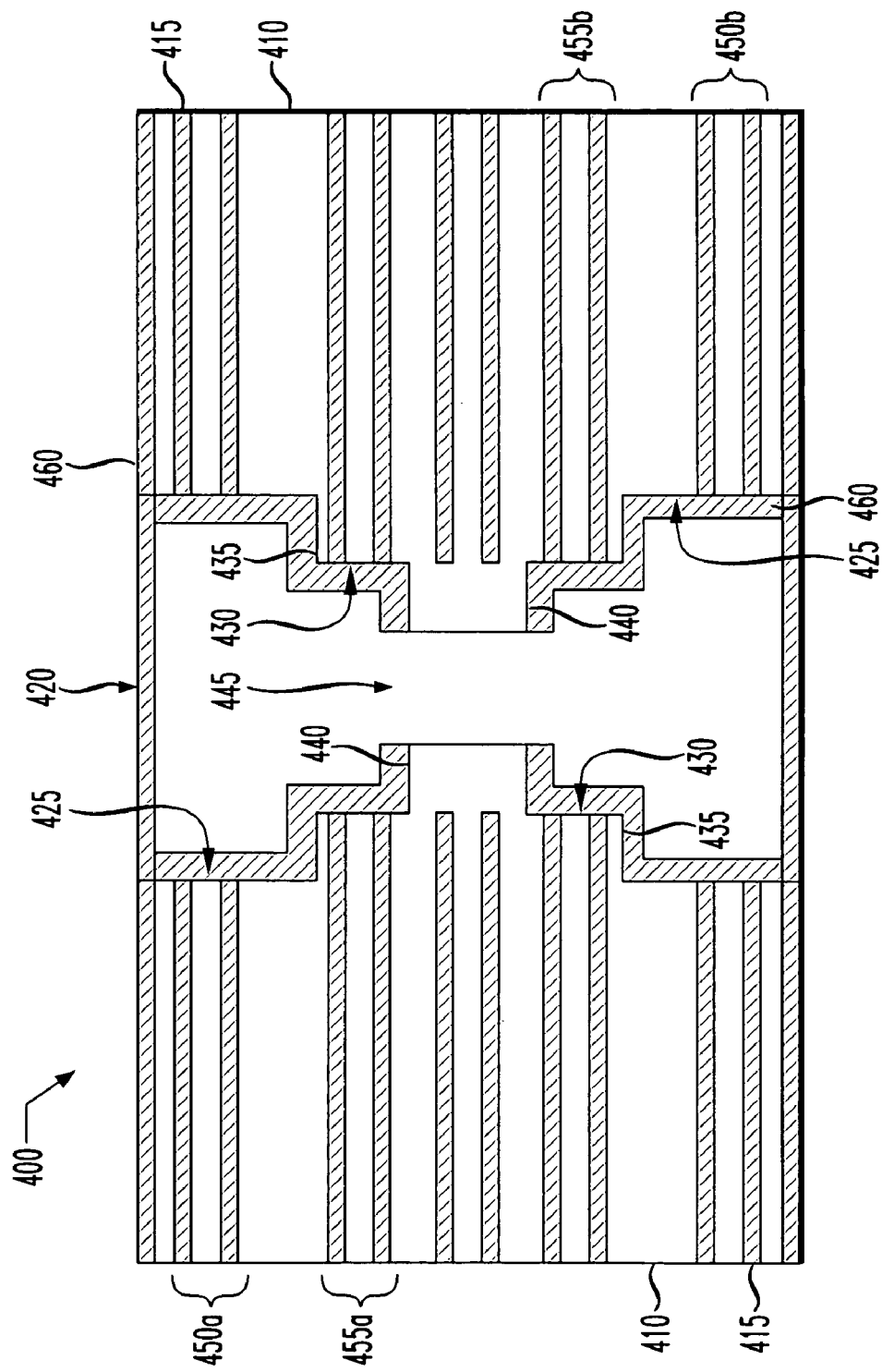
FIG. 4B illustrates an enlarged, partial sectional view of an interconnect after partial removal of the conductive layer within the common opening.

Turning now to FIG. 4B, there is illustrated an enlarged, partial sectional view of the PWB 400 of FIG. 4A after the partial removal of the conductive layer 460. The removal of the conductive layer 460 can be achieved in the same way discussed above regarding other embodiments, that is the appropriate section of conductive layer 460 is selectively removed to disconnect the desired conductive traces. After the removal of the conductive layer 460, the common opening 445 serves has a division point for a first conductive region, including the groups of conductive traces 450*a* and 455*a*, and a second conductive region, including groups of conductive traces 450*b* and 455*b*. As seen in the illustrated embodiment, a portion of the conductive layer 460 electrically connects conductive traces 450*a* and 455*a* to each other and another portion of the conductive layer 460 electrically connects conductive traces 450*b* and 455*b* to each other. Thus, in a single opening, different electrical connections can be made. For example, at least one of the conductive traces in the first group 450*a*, 455*a* may contact a first secondary conductive winding of the transformer within the PWB, and at least one of the conductive traces in the second group 450*b*, 455*b* may contact a second secondary winding of a transformer within PWB. Other connection schemes to other electrical components are, of course, also within the scope of the present invention.

Figure 4C:
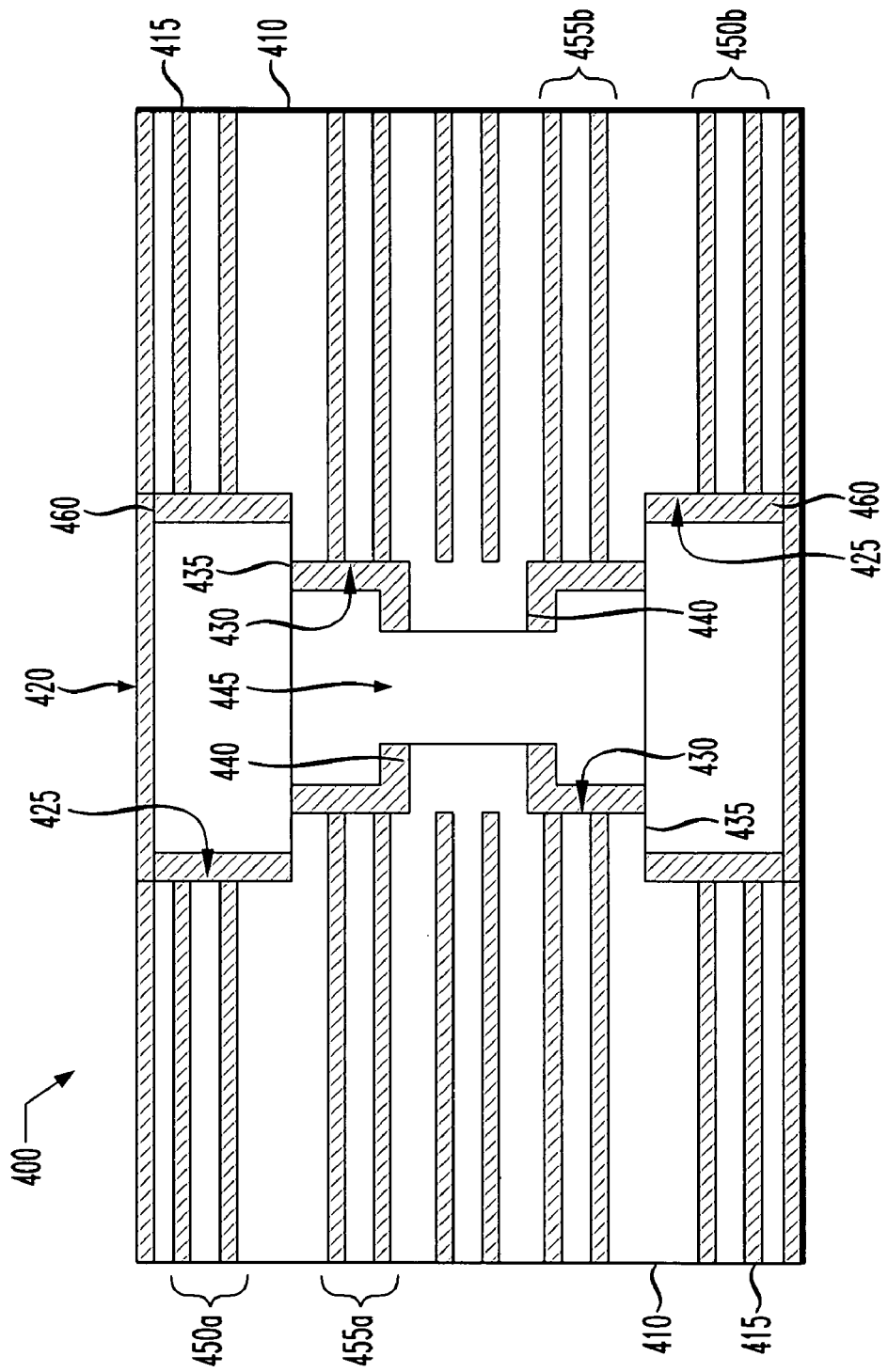
FIG. 4C illustrates an enlarged, partial sectional view of another embodiment after partial removal of the conductive layer within the common opening.

Turning now to FIG. 4C, there is illustrated an enlarged, partial sectional view of the PWB 400 of FIG. 4A after the removal of the conductive layer 460 on the ledges 435. The removal of the conductive layer 460 can be achieved in the same way discussed above regarding other embodiments. In this particular embodiment, however, conductive layer 460 has been partially removed in such a way that conductive traces 450*a*, 450*b*, 455*a* and 455*b* are separate circuits inasmuch as they are not electrically connected to each other by the conductive layer 460. As seen from FIG. 4C, multiple connections can be made through a single opening in the PWB 400.

Figure 5:
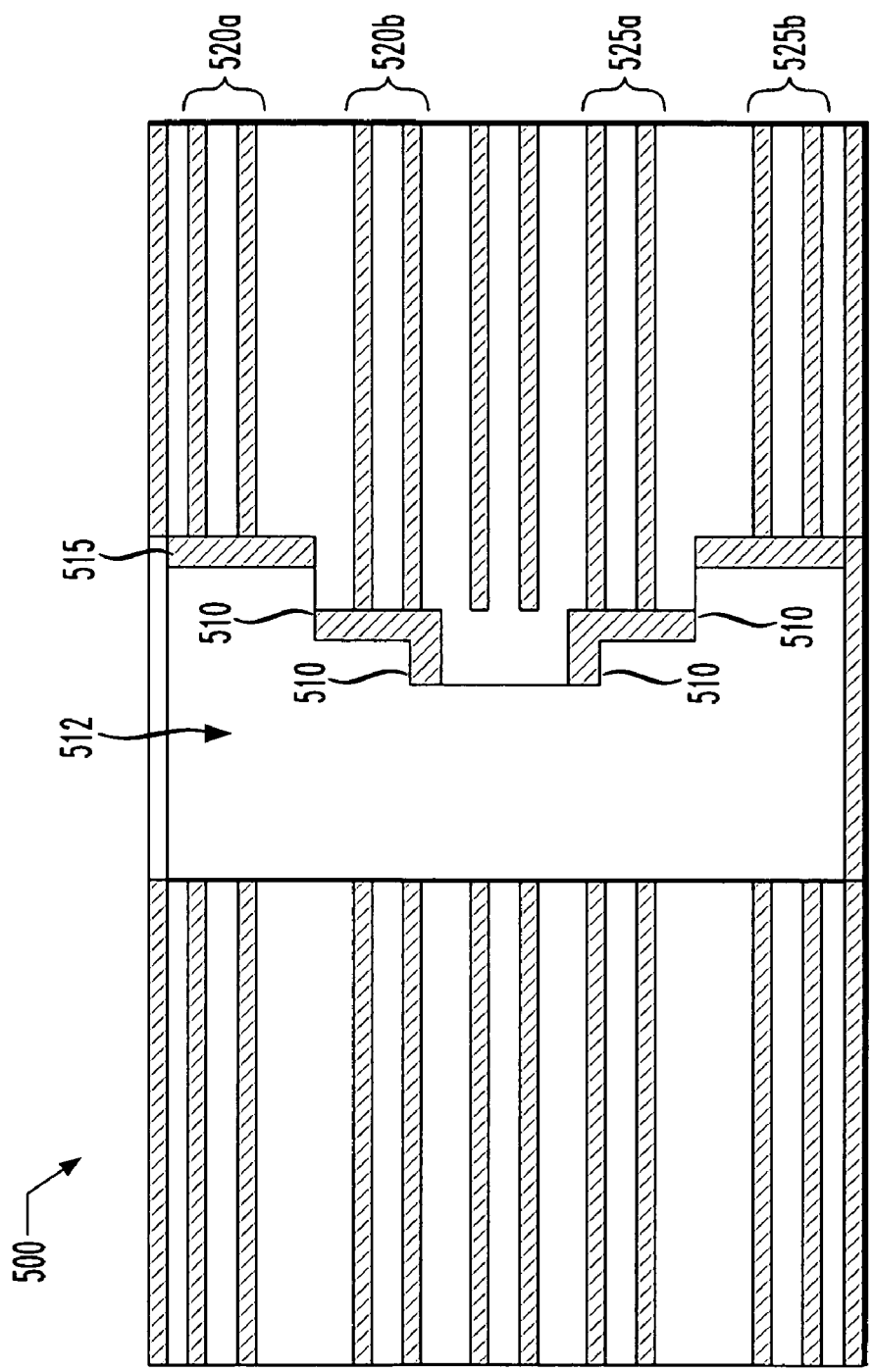
FIG. 5 illustrates an enlarged, partial sectional view of another embodiment where ledges are formed on only one side of the opening.

Turning now to FIG. 5, there is shown an enlarged, partial sectional view of an alternative embodiment of the PWB 500 where ledges 510 are located on only one side of the opening 512. As with the embodiment discussed in FIG. 4C, the conductive layer 515 is removed such that conductive traces 520*a*, 520*b*, 525*a* and 525*b* form separate circuits inasmuch as they are not electrically connected by the conductive layer 515. However, the conductive layer 515 may be removed in any pattern to achieve the desired connection scheme. In the illustrated embodiment, the side opposing the ledges has no conductive layer 515. However, in other embodiments, the conductive layer 515 may be present.

It should be readily appreciated by those skilled in the art, given the teachings herein, that various stair-stepped configurations, including the number of interconnect openings and the sides of the opening on which they appear, or other crenelated configurations, are within the scope of the present invention and may be achieved using the processing techniques described herein or other processes known or readily apparent to those skilled in the art.

Figure 6:
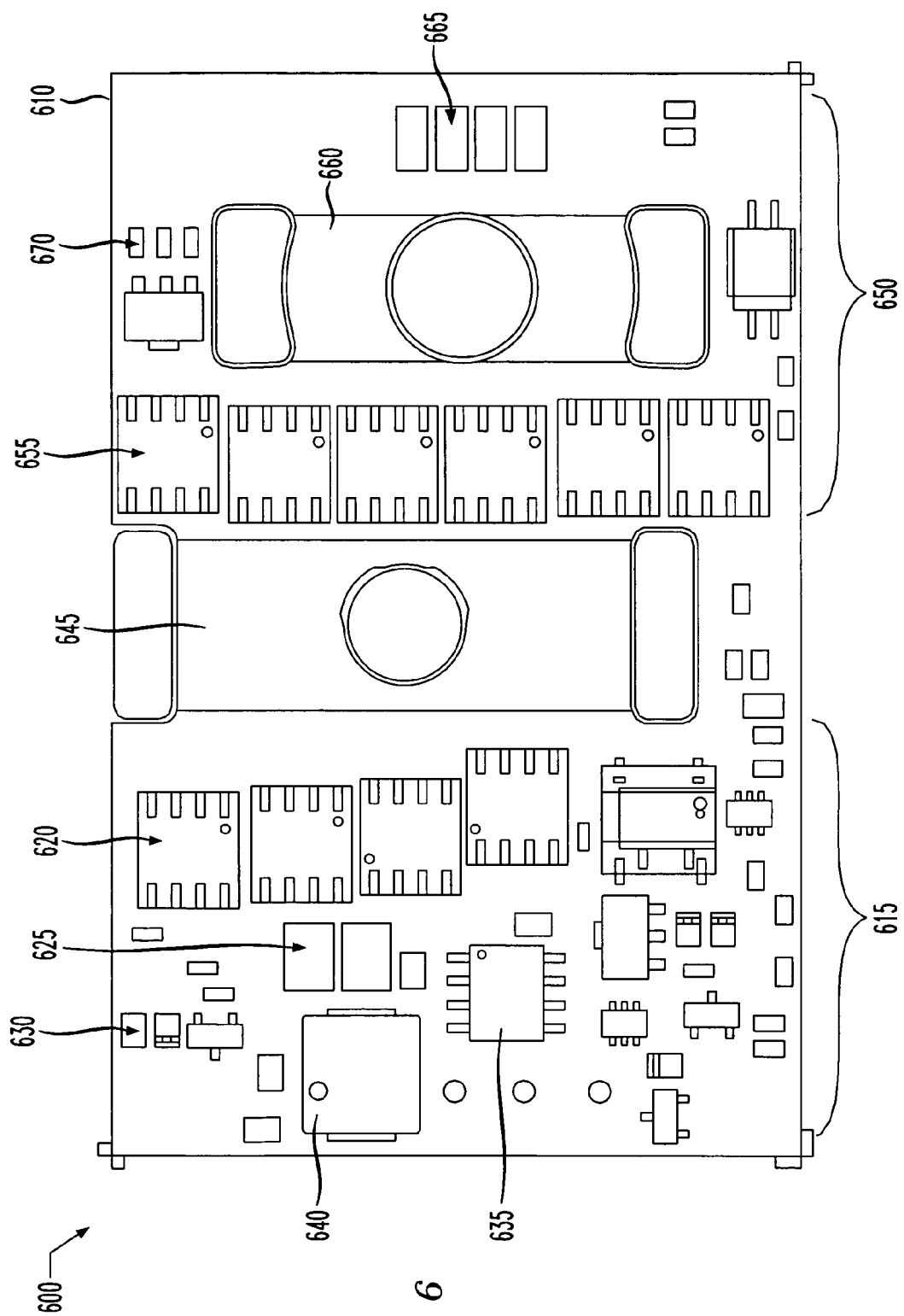
FIG. 6 illustrates an overhead view of a power converter implementing the interconnect provided by the present invention and as discussed herein with respect FIGS. 1 through 4B.

Turning now to FIG. 6, there is illustrated an overhead view of a power converter 600 implementing the edge plate interconnects provided by the present invention and as discussed above with respect to other embodiments. In this embodiment, the power converter 600 includes a PWB 610 including the insulating layers and conductive layers, as discussed above. In one embodiment, the power converter 600 includes a primary circuit 615, including primary inverter switches 620, primary capacitors 625, primary resistors 630, a primary controller 635 and a primary inductor 640. In one embodiment, the primary circuit 615 is electrically connected to the primary winding of a transformer 645, as described above. The power converter 600 further includes a secondary circuit 650 that includes rectifier switches 655, an output inductor 660, output capacitors 665 and output resistors 670. The secondary circuit 650 is electrically connected to the secondary winding of the transformer 645, as also described above. As mentioned above, once in possession of the present invention, one who is skilled in the art would know how to construct the power convert 600.

Although the present invention has been described in detail, those skilled in the art should understand that they can make various changes, substitutions and alterations herein without departing from the spirit and scope of the invention in its broadest form.

What is claimed is:

1. A printed wiring board (PWB) for attaching electrical components thereto, comprising:
   multiple PWB insulating layers; and
   conductive traces located between said insulating layers, said multiple PWB insulating layers having an interconnect opening located therein and intersecting and in contact entirely with at least a portion of said conductive traces, said interconnect opening having ledges therein, wherein each of said ledges separates a first group of said conductive traces from a second group of said conductive traces and said first and second group of conductive traces are located above or below each of said ledges; wherein said ledges having stair-stepped configurations.

2. The PWB as recited in claim 1 wherein a first portion of said opening electrically connects said conductive traces in said first group with each other and a second portion of said opening electrically connects said conductive traces in said second group with each other, said first group and said second group of traces being electrically isolated from each other.

3. The PWB as recited in claim 1 wherein conductive traces within said first group are electrically isolated from conductive traces within said second group.

4. The PWB as recited in claim 1 wherein said interconnect opening is located in an edge of said PWB.

5. The PWB as recited in claim 1 wherein said interconnect opening includes substantially co-aligned concentric interconnect openings located in opposite sides of said PWB and wherein a common opening region is located between and joins said substantially co-aligned concentric openings.

6. The PWB as recited in claim 1 wherein said ledges separate multiple pairs of electrically separate, conductive traces.

7. The PWB as recited in claim 2 wherein a layer of said first group and a layer of said second group are a same layer.

8. A method of manufacturing electrical interconnects for a printed wiring board (PWB), comprising:
   providing multiple insulating layers having conductive traces located therebetween; and forming an opening in said insulating layers and intersecting and in contact entirely with said conductive traces, said opening having ledges therein wherein each of said ledges separates a first group of said conductive traces from a second group of said conductive traces, and said first and second group of conductive traces are located above or below each of said ledges; wherein said ledges having stair-stepped configurations.

9. The method as recited in claim 8 wherein forming said opening includes forming concentric interconnect openings of increasing circumferences.

10. The method as recited in claim 9 wherein forming said concentric interconnect openings includes forming substantially co-aligned concentric interconnect openings on opposite sides of said PWB, wherein a common opening that extends through a portion of said PWB is one of said co-aligned concentric openings, said common opening dividing said PWB into a first conductive region and a second conductive region.

11. The method as recited in claim 10 further including depositing a conductive layer on the side walls of said concentric openings, said conductive metal electrically connecting said first conductive region with said second conductive region.

12. The method as recited in claim 11 wherein each of said first and second conductive regions includes more than one ledge and multiple pairs of conductive traces.

13. The method as recited in claim 11 further including removing said conductive layer within said common opening, to thereby electrically disconnect said first conductive region from said second conductive region.

14. The method as recited in claim 13 wherein removing said conductive metal includes removing a portion of said insulating layers intersected by said common opening.

* * * * *